United States Patent
Hatol et al.

(10) Patent No.: US 11,212,941 B2
(45) Date of Patent: Dec. 28, 2021

(54) EQUIPMENT SHELF

(71) Applicant: Astec International Limited, Kowloon (HK)

(72) Inventors: Angelito Hatol, Antipoto (PH); Benigno Jr. Pasco, Pasig (PH); Iain Scott, Pasig (PH)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 16/923,773

(22) Filed: Jul. 8, 2020

(65) Prior Publication Data
US 2021/0378146 A1 Dec. 2, 2021

Related U.S. Application Data

(60) Provisional application No. 63/032,864, filed on Jun. 1, 2020.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |

(52) U.S. Cl.
CPC ................ *H05K 7/20563* (2013.01)

(58) Field of Classification Search
CPC .. H05K 7/1485; H05K 7/1487; H05K 7/1488; H05K 7/1489; H05K 7/1491; H05K 7/1492; H05K 7/20563; H05K 7/20572; H05K 7/20581; H05K 7/20554; H05K 7/20536
See application file for complete search history.

(56) References Cited

U.S. PATENT DOCUMENTS

| | | | | |
|---|---|---|---|---|
| 5,982,652 A | * | 11/1999 | Simonelli | H02M 1/10 363/142 |
| 6,310,783 B1 | * | 10/2001 | Winch | H02J 7/0029 361/797 |
| 6,317,348 B1 | * | 11/2001 | Vackar | H02J 9/00 363/144 |
| 6,948,021 B2 | * | 9/2005 | Derrico | G06F 1/18 710/302 |
| 7,339,786 B2 | * | 3/2008 | Bottom | H04L 49/351 361/679.41 |
| 7,719,823 B2 | * | 5/2010 | Josten | H02B 1/21 361/611 |
| 8,174,821 B2 | * | 5/2012 | Fontana | H02B 3/00 361/601 |
| 9,072,191 B2 | * | 6/2015 | Silberbauer | H05K 7/1432 |
| 9,454,189 B1 | * | 9/2016 | Chen | G06F 1/263 |

(Continued)

*Primary Examiner* — Anthony M Haughton

(57) ABSTRACT

An equipment shelf includes at least one power supply unit (PSU) positioned in an upper region of the equipment shelf. The equipment shelf also includes at least one battery backup unit (BBU) positioned in a lower region of the equipment shelf. An airflow path extends through the equipment shelf between the upper region and the lower region. The airflow path separates the upper region of the equipment shelf from the lower region of the equipment shelf and thermally isolates the at least one PSU in the upper region from the at least one BBU in the lower region when air flows through the airflow path. Other example equipment shelves are also disclosed.

15 Claims, 11 Drawing Sheets

(56) References Cited

U.S. PATENT DOCUMENTS

| | | | |
|---|---|---|---|
| 10,327,354 B1* | 6/2019 | Kim | H05K 7/1492 |
| 2004/0168818 A1* | 9/2004 | Layden | H02J 7/0042 |
| | | | 174/50 |
| 2005/0286235 A1* | 12/2005 | Randall | H05K 7/1492 |
| | | | 361/724 |
| 2010/0314166 A1* | 12/2010 | Malkowski, Jr. | H02B 1/21 |
| | | | 174/72 B |

* cited by examiner

EQUIPMENT SHELF

CROSS-REFERENCE TO RELATED APPLICATION

This application claims the benefit of U.S. Provisional Application No. 63/032,864 filed Jun. 1, 2020. The entire disclosure of the above application is incorporated herein by reference.

FIELD

The present disclosure relates to an equipment shelf, and in particular, an equipment shelf enabling enhanced thermal performance of equipment stored thereon.

BACKGROUND

This section provides background information related to the present disclosure which is not necessarily prior art.

Various electronic equipment is commonly mounted in racks, for example at data centers, to compactly house the electronic equipment during operation and use of the electronic equipment. The electronic equipment may be included in a shelf that is mounted in the rack. Some electronic equipment is known to generate heat during operation and some electronic equipment is known to be temperature-sensitive such that the equipment performs better under certain temperature conditions.

SUMMARY

This section provides a general summary of the disclosure, and is not a comprehensive disclosure of its full scope or all of its features.

According to one aspect of the present disclosure, an equipment shelf includes at least one power supply unit (PSU) positioned in an upper region of the equipment shelf. The equipment shelf also includes at least one battery backup unit (BBU) positioned in a lower region of the equipment shelf. An airflow path extends through the equipment shelf between the upper region and the lower region. The airflow path separates the upper region of the equipment shelf from the lower region of the equipment shelf and thermally isolates the at least one PSU in the upper region from the at least one BBU in the lower region when air flows through the airflow path.

According to another aspect of the present disclosure, a power shelf includes an enclosure having a plurality of upper receptacles and a plurality of lower receptacles. The power shelf also includes multiple power supply units (PSUs) positioned within the plurality of upper receptacles and multiple battery back-up units (BBUs) positioned within the plurality of lower receptacles. The power shelf also includes an airflow region between the multiple PSUs and the multiple BBUs.

According to another aspect of the present disclosure, a rack-mounted equipment shelf includes an enclosure having at least one receptacle for housing electronic equipment. The equipment shelf also includes electronic equipment positioned within the at least one receptacle. A channel is coupled to the enclosure and at least one fan is coupled to the channel to draw air through the channel, whereby the air drawn through the channel maintains the electronic equipment and/or the shelf at a desired temperature.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 5:
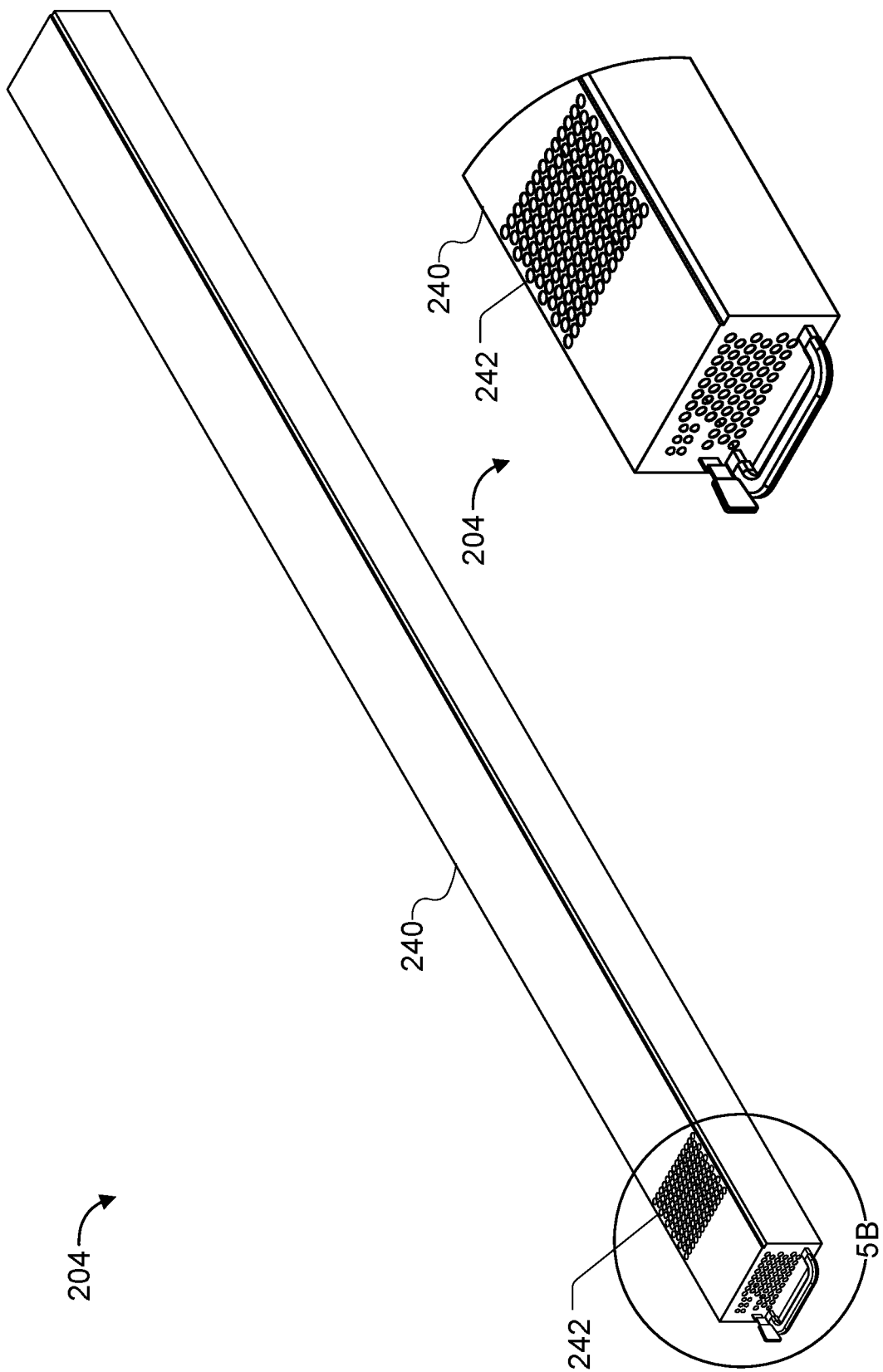

FIGS. 5A-B are perspective views of a power supply unit (PSU).

Figure 6:
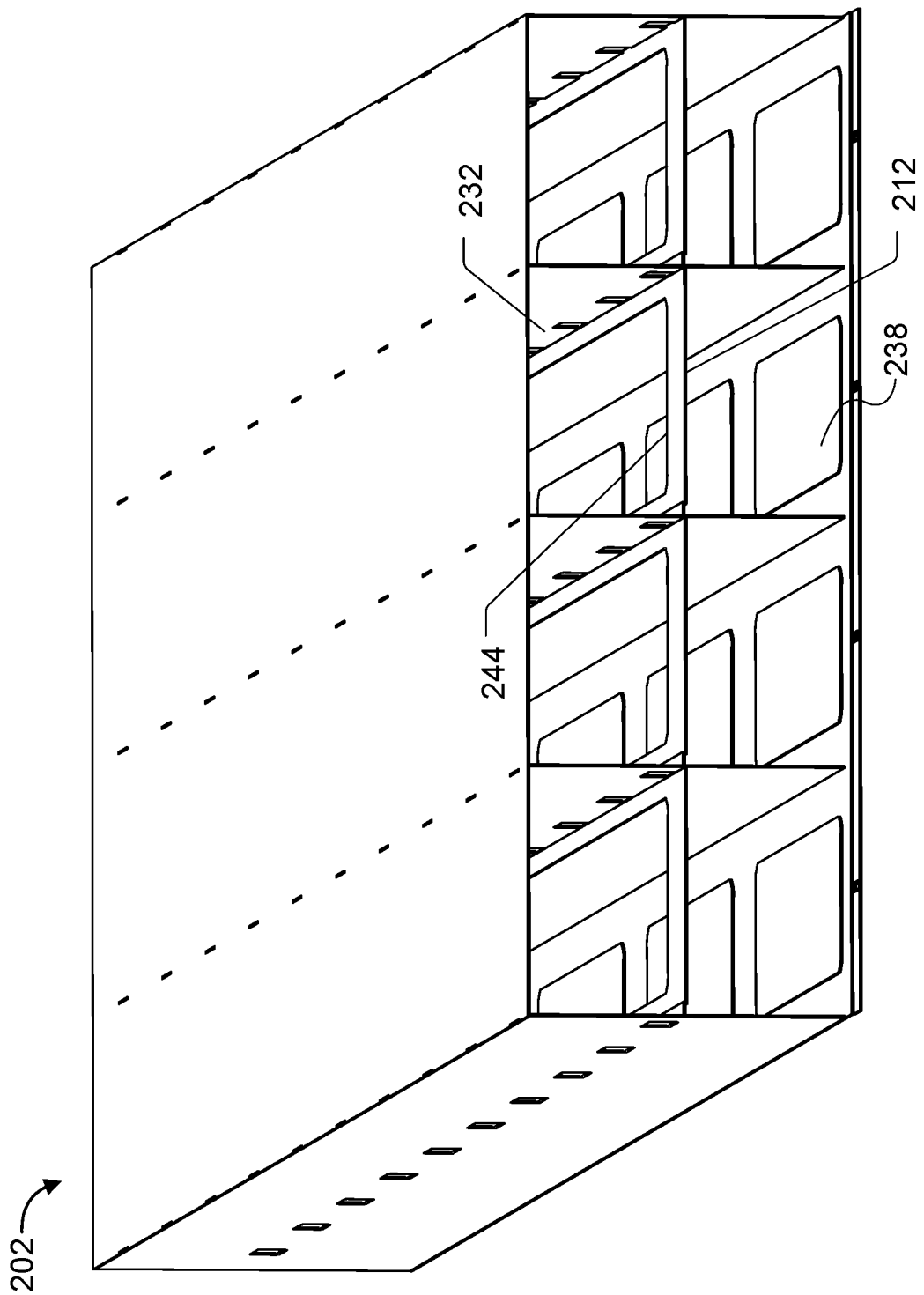

FIG. 6 is a front view of an example shelf.

Figure 7B:
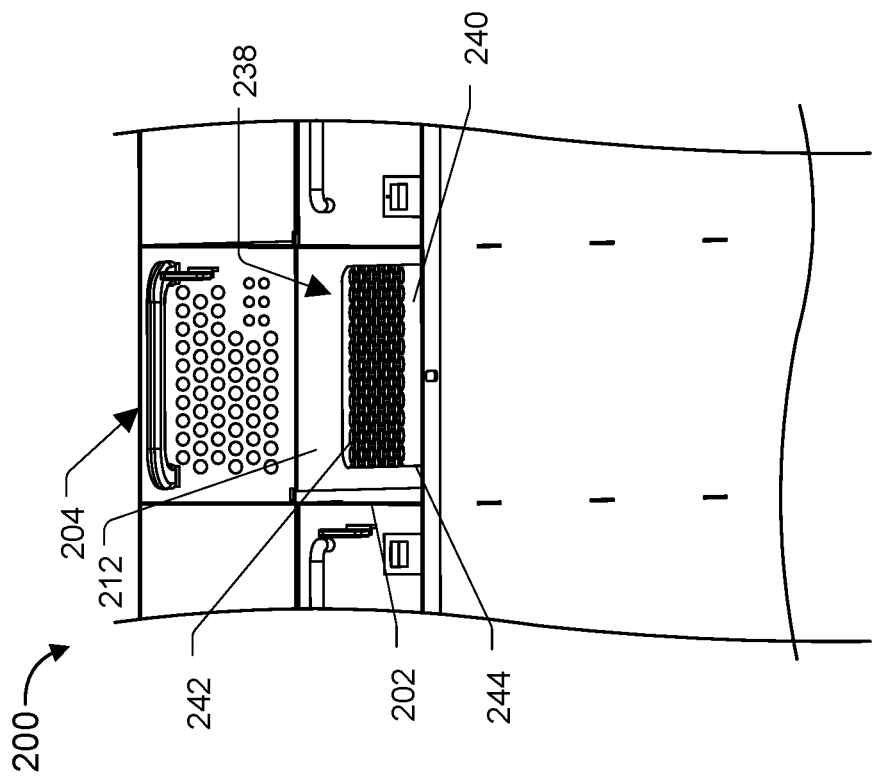
Figure 7A:
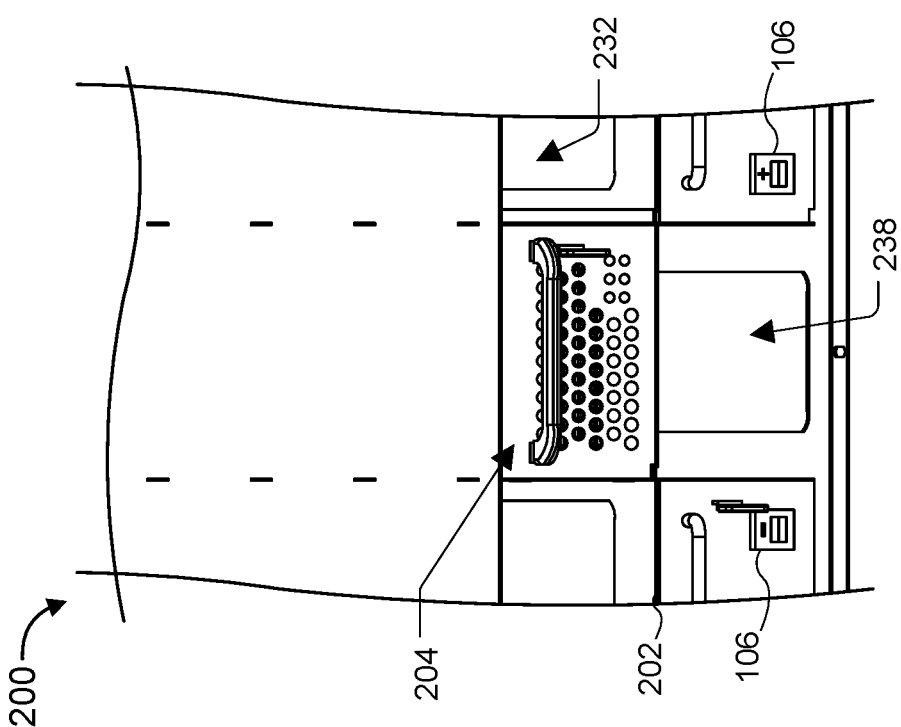

FIGS. 7A-B are front perspective views of an example rack-mounted equipment shelf including the PSU of FIGS. 5A-B and the shelf of FIG. 6.

Figure 8:
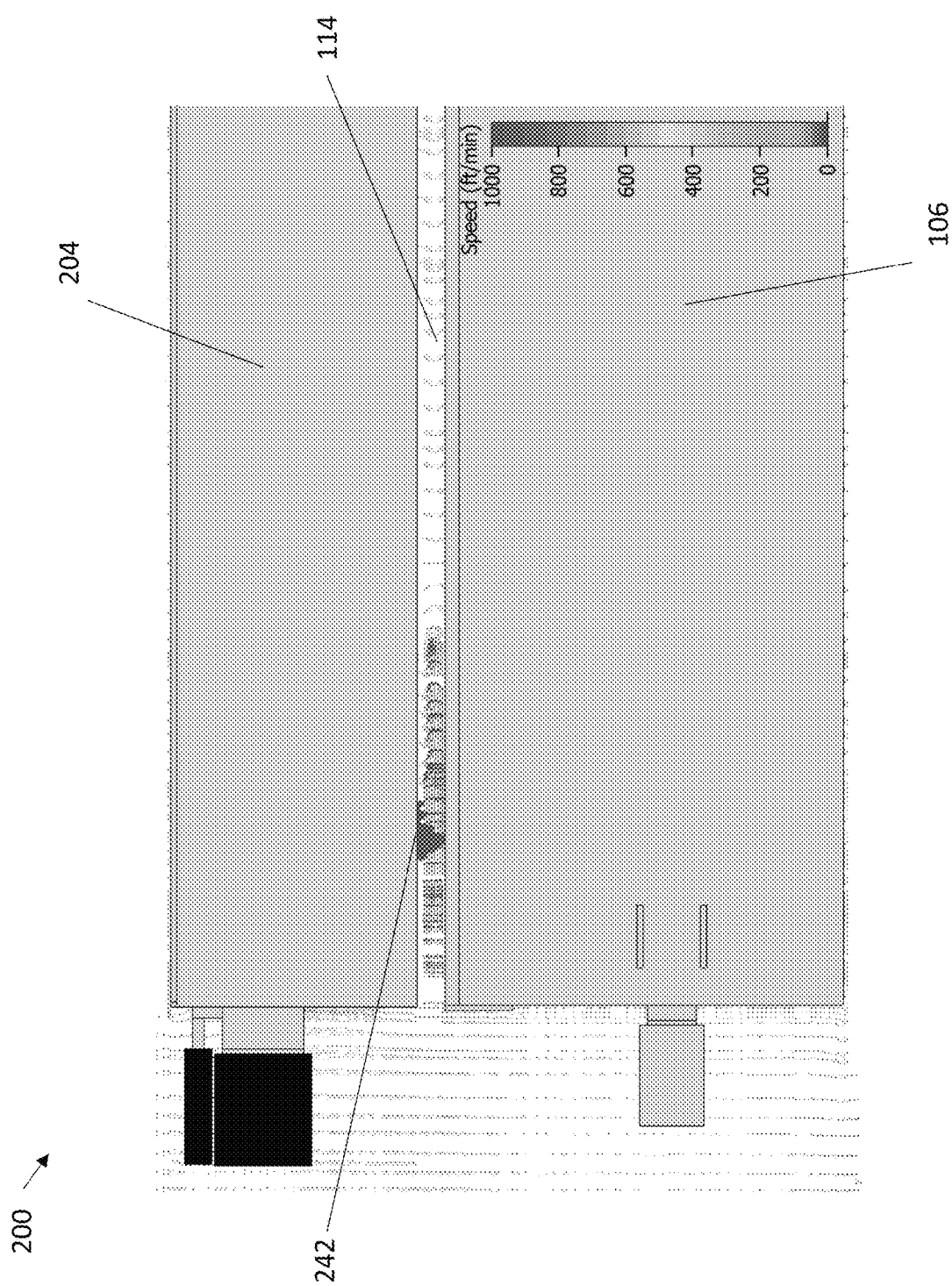

FIG. 8 is a schematic flow diagram illustrating air flow through the rack-mounted equipment shelf of FIGS. 7A-6B during operation.

Figure 1:
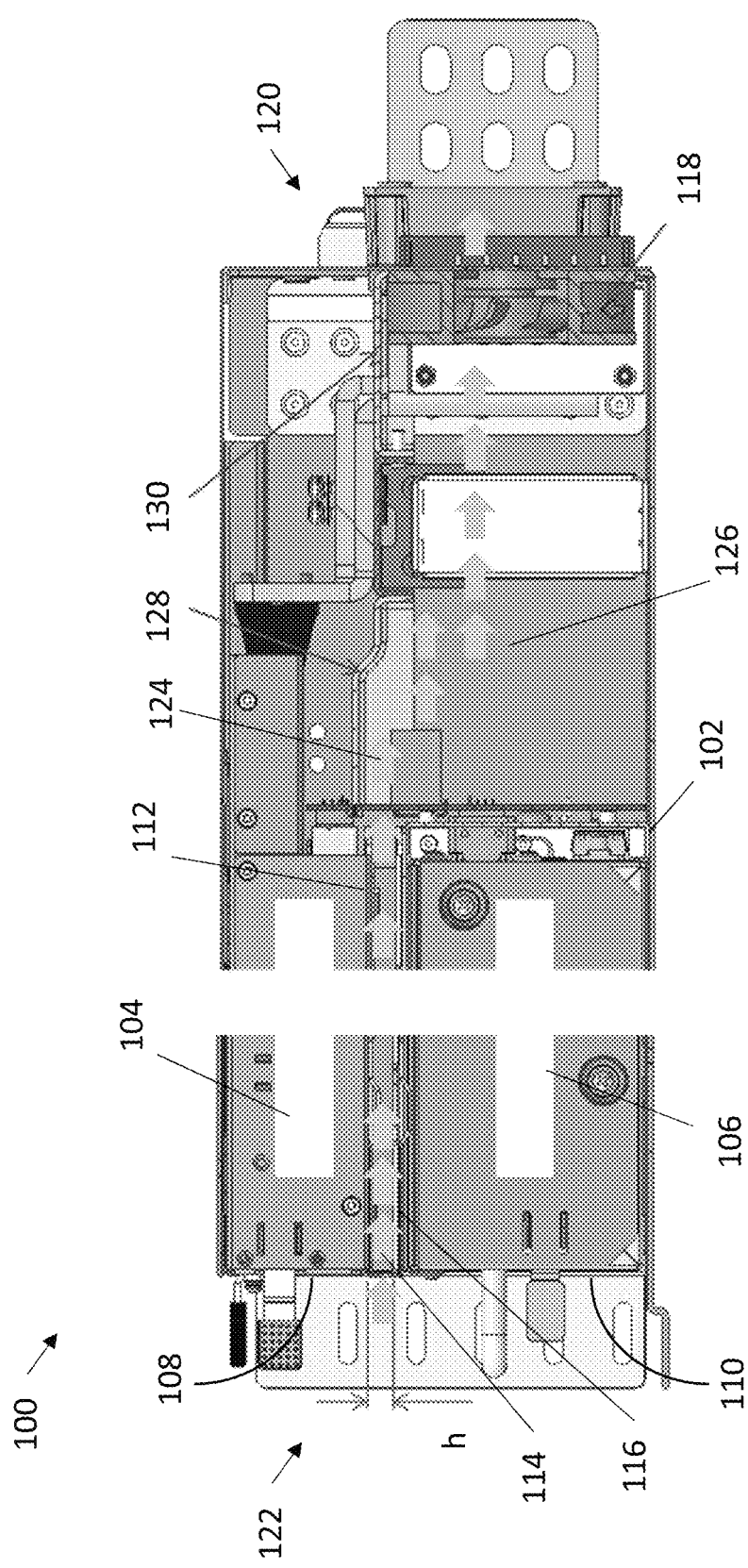
FIG. 1 is a side view of an example rack-mounted equipment shelf.
Figure 9:
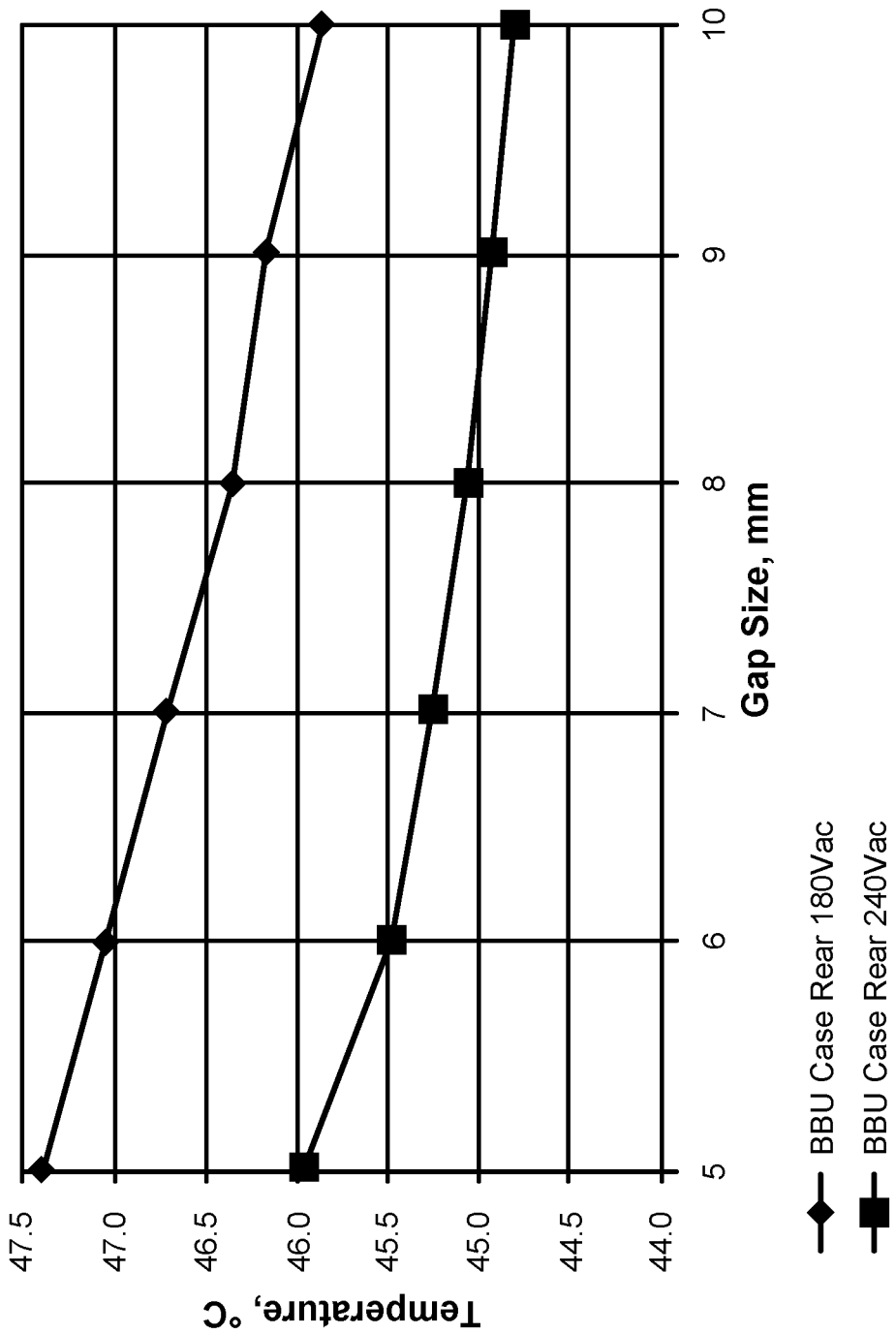

FIG. 9 is a graph illustrating the temperature of equipment in the rack-mounted equipment shelf of FIG. 1 with respect to gap size.

Figure 10:
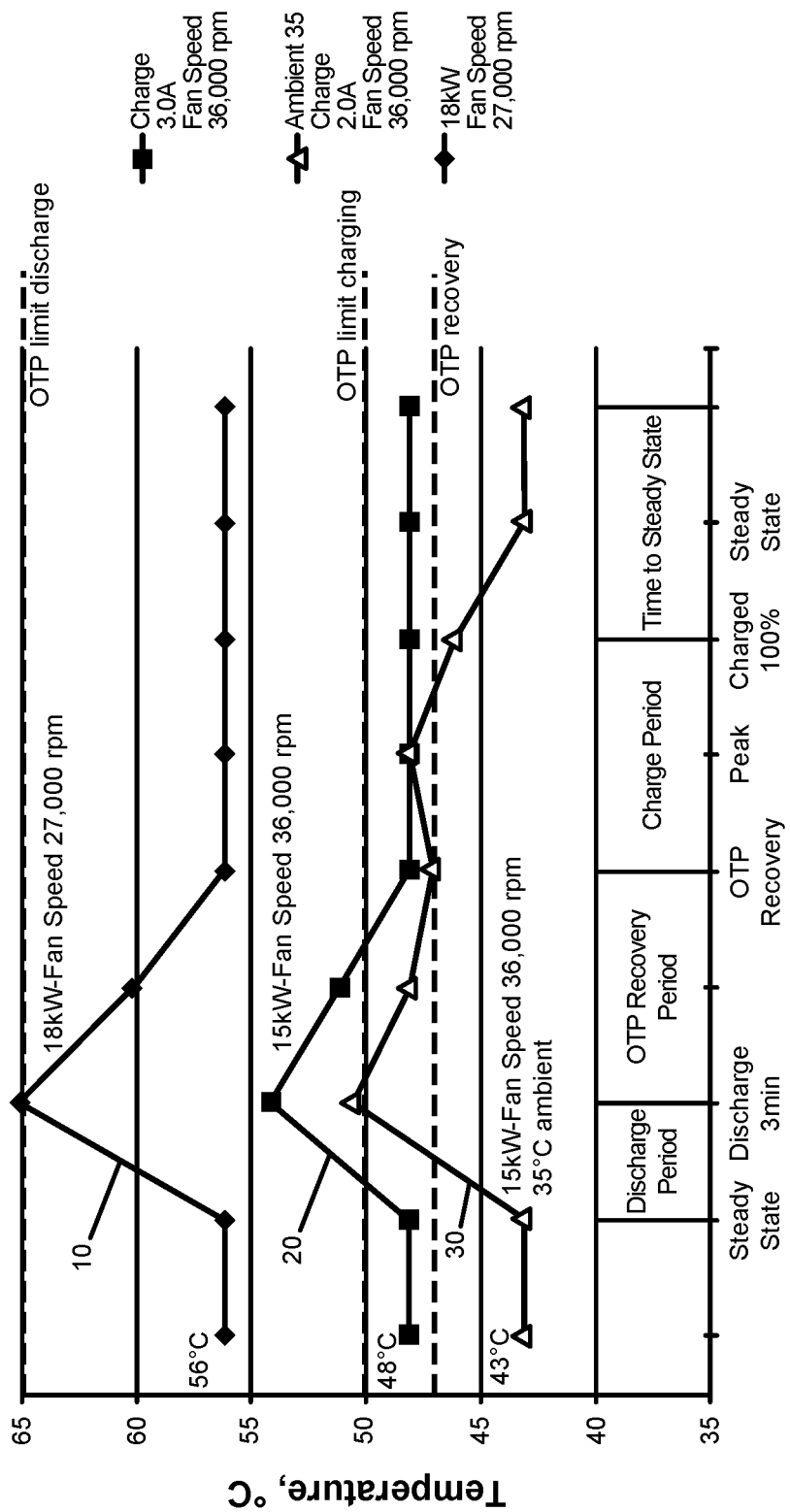

FIG. 10 is a graph illustrating the temperature of equipment in an equipment shelf without certain features included in the equipment shelf of FIG. 1 during multiple modes of operation.

Figure 11:
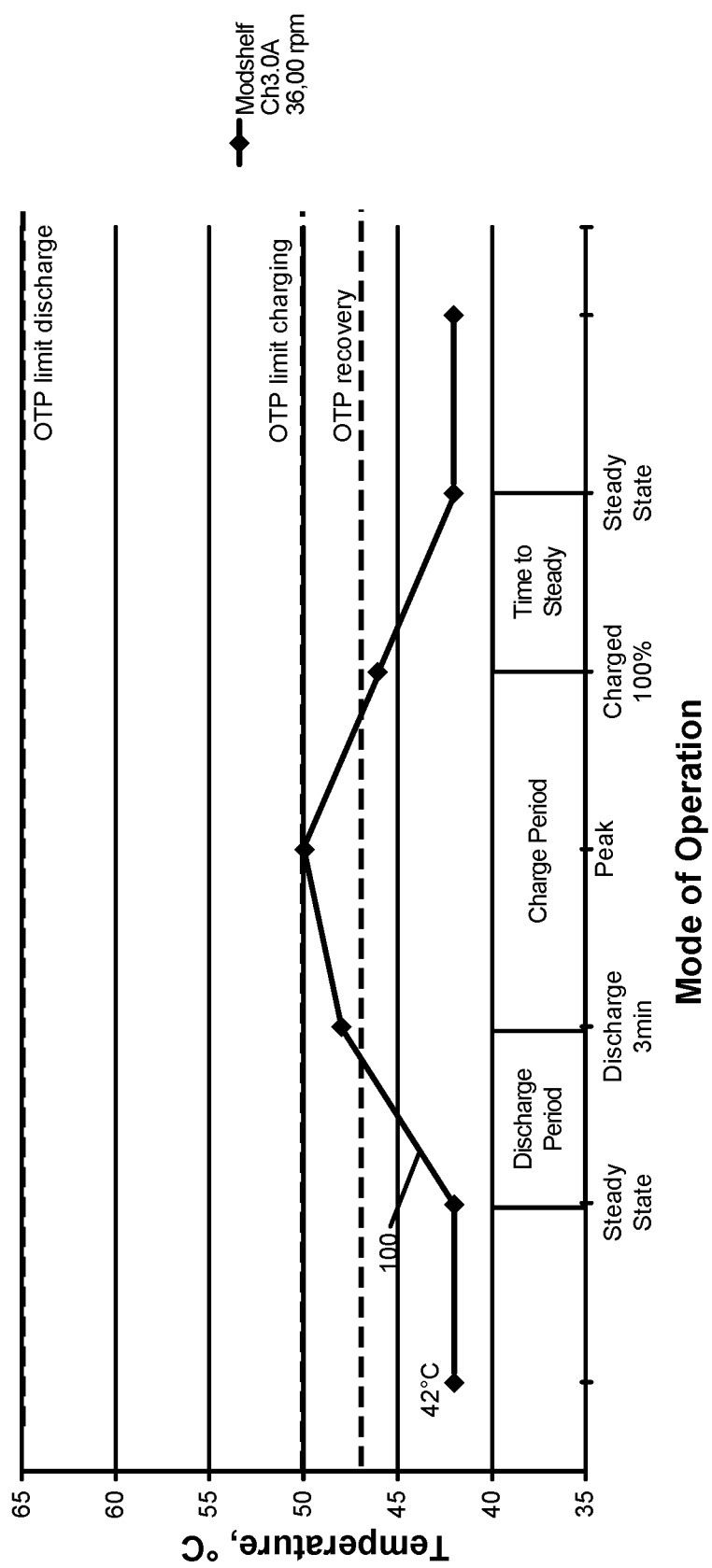

FIG. 11 is a graph illustrating the temperature of equipment in the equipment shelf of FIG. 1 during multiple modes of operation.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

An equipment shelf according to one example embodiment of the present disclosure is illustrated in FIG. 1 and indicated generally by reference number 100. The equipment shelf 100 includes an enclosure 102 for supporting and/or housing electronic equipment within the equipment shelf 100. The electronic equipment includes various electronic equipment such as heat-generating equipment (e.g., electronic equipment with a high heat loss density and a high operating temperature) and/or thermally-sensitive equipment (e.g., electronic equipment whose performance is impacted by temperature (e.g., precision control devices, measurement devices, battery devices, etc.)). The enclosure 102 is configured to support and/or house the electronic equipment during operation and use of the electronic equipment.

As shown in FIG. 1, the equipment shelf 100 includes both heat-generating equipment and temperature-sensitive equipment. In other embodiments, an equipment shelf may include only heat-generating equipment or only temperature-sensitive equipment. In the illustrated embodiment, the equipment shelf 100 is configured as a power shelf. As shown in FIG. 1, a power supply unit (PSU) 104 and a battery back-up unit (BBU) 106 are included within the equipment shelf 100. Although only one PSU 104 and only one BBU 106 are illustrated in FIG. 1, the equipment shelf 100 may include multiple PSUs 104 and multiple BBUs 106. In some embodiments, the equipment shelf 100 includes an equal number of PSUs 104 and BBUs (e.g., six PSUs 104 and six BBUs 106, three PSUs 104 and three BBUs 106, etc.). The PSU 104 is an example of heat-generating equipment as the PSU 104 generates heat within enclosure 102 during operation and has a high heat loss density and a high operating temperature. The BBU 106 is equipment that is sensitive to temperature (e.g., high temperatures) during operation. For example, temperature is a critical parameter for BBUs affecting functionality of the battery such as performance and battery life.

As shown in FIG. 1, PSU 104 is included in an upper region 108 of the equipment shelf 100 and BBU 106 is included in a lower region 110 of the equipment shelf 100. In alternate embodiments, PSU 104 is positioned within the lower region 110 and BBU 106 is positioned in the upper region 108. In general, heat-generating equipment is included in a separate region of the equipment shelf 100 than any temperature-sensitive equipment.

To support the electronic equipment included in the upper region 108, the enclosure 102 of the equipment shelf 100 includes a partition or support plate 112 in the upper region 108. The support plate 112 generally divides the equipment shelf 100 along a mid-plane of equipment shelf 100. Equipment in the upper region 108 of the equipment shelf 100 may be positioned on the support plate 112 of the enclosure 102. In the illustrated embodiment, the PSU 104 is positioned within the upper region 108 and coupled to support plate 112.

The equipment shelf 100 includes an airflow region 114 (e.g., a channel, a gap, etc.) to permit moving air to flow through the equipment shelf 100. The airflow region 114 is positioned between the upper region 108 and the lower region 110 of the equipment shelf 100. In this way, the air moving through the airflow region 114 thermally isolates the equipment included in the upper region 108 (e.g., one or more PSUs 104) from equipment included in the lower region 110 (e.g., one or more BBUs 108). For example, the airflow region 114 thermally isolates the heat-generating equipment (e.g., PSUs 104) from the temperature-sensitive equipment (e.g., BBUs 106).

The airflow region 114 is defined by and extends vertically between the support plate 112 of the upper region 108 and a secondary plate 116 that is configured to retain the BBU 106 within the enclosure 102. In some embodiments, the secondary plate 116 is omitted, such that the airflow region 114 is defined by the support plate 112 and an upper surface of the BBU 106. In these embodiments, other features may be included to retain the BBU 106 within the enclosure 102.

The height h of the airflow region 114 is generally sized to permit air to flow through the airflow region 114 and thermally isolate the equipment in the upper region 108 from equipment in the lower region 110. The height h may be adjusted based on the equipment included in the equipment shelf 100, the operating conditions/parameters of such equipment, the overall equipment shelf height requirements, environmental factors such as ambient temperature, etc. Size considerations of the airflow region 114 are discussed in more detail below.

As shown in FIG. 1, the airflow region 114 generally extends horizontally along at least a length of the equipment (e.g., PSUs 104 and BBUs 106) in equipment shelf 100, through a mid-plane of the equipment shelf 100. In the example embodiment, the airflow region 114 is positioned above a center of the equipment shelf 100 due to the sizing of the equipment in the lower region 110. As can be appreciated, the airflow region 114 may be adjusted higher or lower (e.g., with respect to a bottom of the enclosure 102 (e.g., bottom plate 136 shown in FIG. 4)) depending on the size of the equipment in the upper region 108 and the lower region 110. In this way, the airflow region 114 extends generally through a mid-plane of the equipment shelf 100 that passes between the equipment in the upper region 108 (e.g., PSU 104) and the equipment in the lower region 110 (e.g., BBU 106), whereby moving air (e.g., ambient air) passes between the upper region 108 and the lower region 110 to thermally isolate the two regions.

Figure 2:
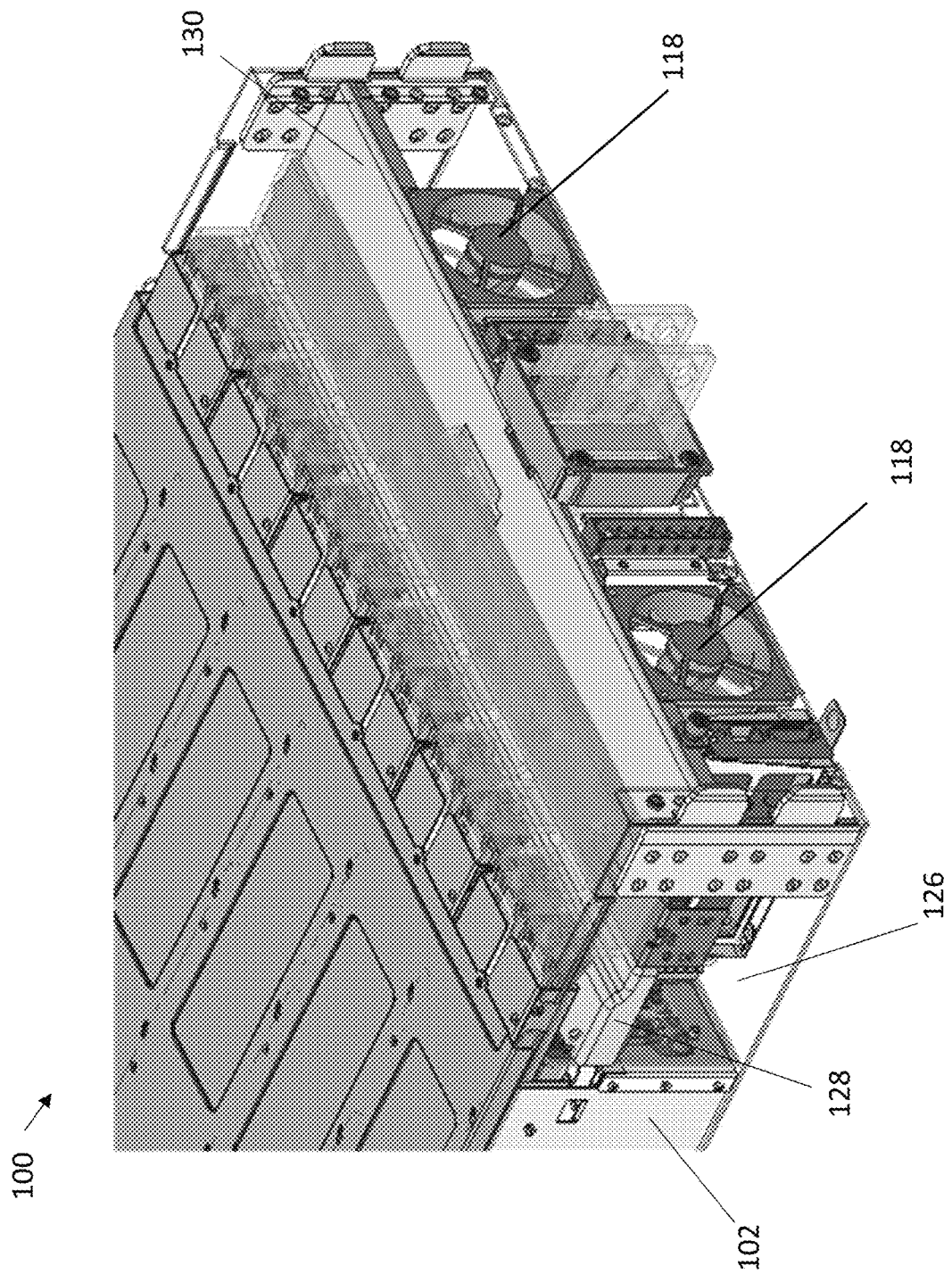
FIG. 2 is a rear perspective view of the equipment shelf of FIG. 1.

The equipment shelf 100 also includes at least one fan 118. As shown in FIG. 2, the equipment shelf 100 includes two fans 118. In some embodiments, a greater or lesser number of fans 118 may be included in the equipment shelf 100. In the illustrated embodiment, the fan 118 is generally coupled to the airflow region 114 (e.g., indirectly coupled) and mounted on the equipment shelf 100 at a first end 120 (e.g., a rear end) of the equipment shelf 100. The fan 118 is configured to draw air through airflow region 114 from a second end 122 (e.g., a front end) of the equipment shelf 100. In alternate embodiments, one or more fans 118 may be located at other positions on or within the equipment shelf 100 (e.g., at a front end 122 of the enclosure 102) and/or provided on the rack (not shown). The air drawn into the airflow region 114 by the fan 118 is generally at an ambient temperature. This ambient temperature is relatively cool in comparison to a temperature of the heat-generating PSUs 104 included within the equipment shelf 100. As the ambient temperature passes through the airflow region 114, the flowing air thermally isolates the upper and lower regions 108, 110 and generally lowers the temperature of any structure or equipment defining the airflow region 114 (e.g., at a boundary or edge of the airflow region 114). In this way, rather than cooling the equipment shelf 100 in a general manner, the fan 118 included in this embodiment creates a directed air stream through the airflow region 114 of the equipment shelf 100 to thermally de-couple portions of the equipment included within the equipment shelf 100 (e.g., heat-generating equipment is de-coupled from thermally-sensitive equipment).

With continued reference to FIG. 1, arrows 124 generally indicate the path of air flowing through the equipment shelf 100 (e.g., through the airflow region 114 and a rear portion 126 of the equipment shelf 100). As shown in FIG. 1, the air flowing through the airflow region 114 follows a single path, as indicated by arrows 124, through the equipment shelf 100. For example, the air flows from the front end 122 of the equipment shelf 100 through the airflow region 114 to the rear portion 126 of the equipment shelf 100 (e.g., an area of the equipment shelf 100 behind the PSUs 104 and BBUs 106) where the air then flows out of the rear end 120 of the equipment shelf 100 as drawn by fan 118. As can be appreciated, the ambient air moving through the airflow region 114 enables thermal isolation of the BBU 106 in the lower region 110 from heating by the PSU 104 in the upper region 108, thus allowing the BBU 106 to operate at lower temperatures which improves BBU 106 performance.

In the illustrated embodiment, rather than enabling air to flow through the equipment shelf 100 in multiple different directions (e.g., along multiple different paths), the airflow region 114 generally enables air to pass through the equipment shelf 100 in a single direction from a lower temperature, or cool, side of the equipment shelf 100 to a higher temperature, or hot, side of the equipment shelf 100 (e.g., from the front end 122 to the rear end 120). In alternate embodiments, the airflow region 114 may enable air to pass through the equipment shelf 100 from the rear end 120 to the front end 122 (e.g., where the rear end 120 is the cool side and the front end 122 is the hot side of the equipment shelf 100). The use of a single airflow path (e.g., as shown by arrows 124) simplifies the design of the equipment shelf 100 as well as minimizes the airflow impedance of the equipment shelf 100. By minimizing airflow impedance (e.g., by utilizing a single airflow path), maximum airflow is achieved for a given fan. In addition, the single airflow path (e.g., as shown by arrows 124) enables use of a quieter, slower, less expensive, etc. fan for a given airflow due to the minimized airflow impedance. For example, a more powerful, louder, and/or more expensive fan (or multiple fans) would be required when multiple airflow paths are included in an equipment shelf due to the increased airflow impedance caused by the multiple paths.

As shown in FIGS. 1 and 2, the equipment shelf 100 includes one or more baffles 128, 130 to further define the path for the air moving through the equipment shelf 100 (e.g., to guide the air exiting the airflow region 114 through the rear portion 126 towards the rear end 120 of the equipment shelf 100). Baffles 128, 130 limit and/or inhibit the mixing of air exhausted by the equipment in the upper region 108 from the air exiting the airflow region 114. When heat-generating equipment (e.g., one or more PSUs 104) is included in the upper region 108, such equipment generates heat which is generally exhausted from the equipment. To prevent this exhausted hot air from mixing with the air (e.g., ambient air) drawn through the airflow region 108, baffles 128 and 130 are positioned in such a manner as to block any airflow between the PSUs 104 and the fans 118.

Generally, baffles 128 and 130 are positioned between the upper region 108 of the equipment shelf 100 and the airflow region 114 to separate the upper region 108 from the airflow region 114 (e.g., air exiting the airflow region). The baffles 128, 120 are positioned within the rear portion 126 of the equipment shelf 100 (e.g., behind the PSUs 104 and BBUs 106 in the equipment shelf 100). In the example embodiment, baffle 128 is coupled to the support plate 112 of the enclosure 102 towards the rear end 120 of the equipment shelf 100 and baffle 130 is coupled to the equipment shelf 100, at the rear end 120 of the equipment shelf 100, above the fan 118. In this way, the baffles 123, 130 are positioned to block airflow between the PSUs 104 and fans 118. Baffles 128, 130 may also seal against other electronics included in the rear portion 126 of the equipment shelf 100 (e.g., a backplane PCB) to inhibit airflow mixing. In other embodiments, a greater or lesser number of baffles may be used, positioned in similar or different configurations, to inhibit PSU exhaust from mixing with ambient air drawn through the airflow region 114.

Figure 3:
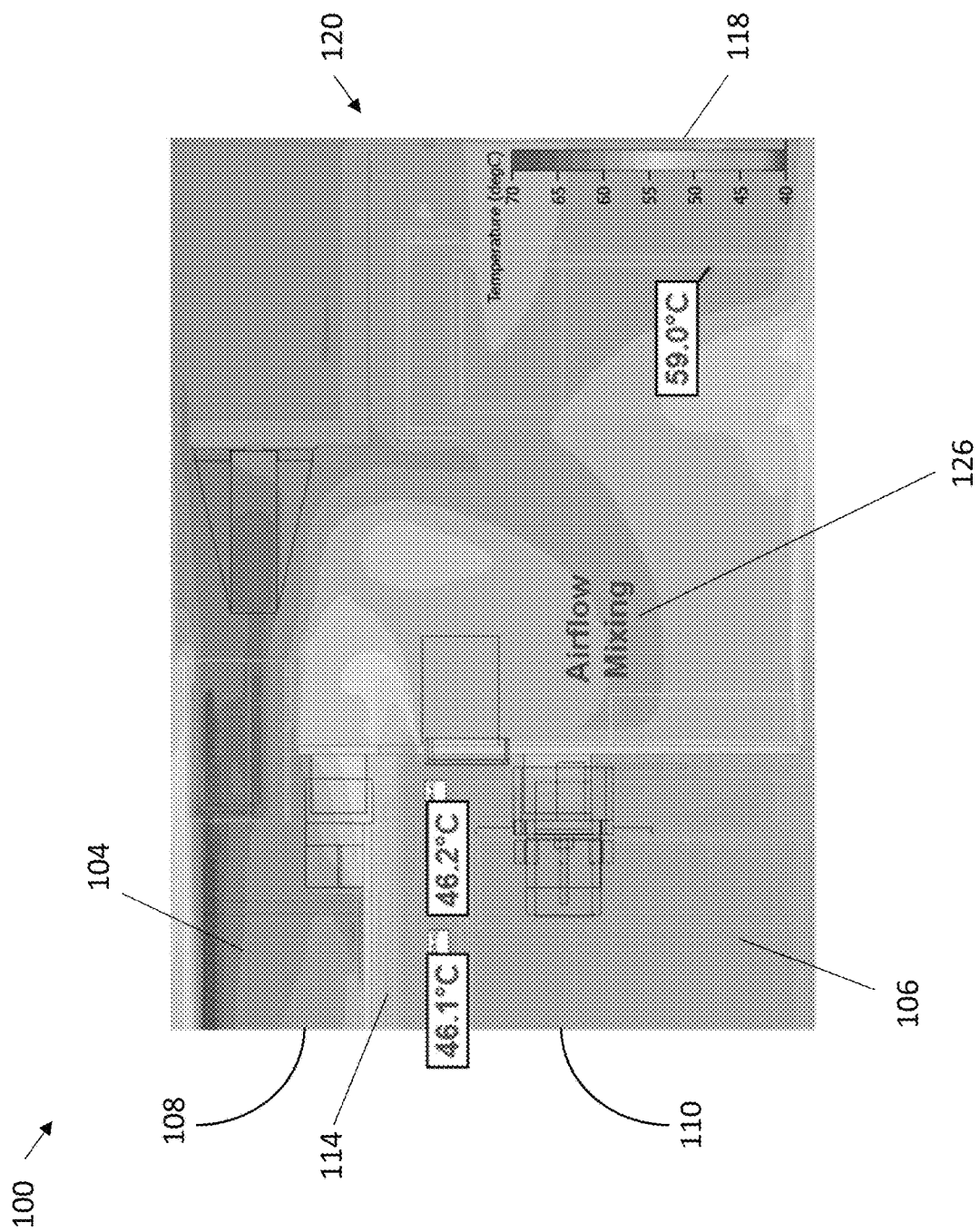
FIG. 3 is a temperature map of the equipment shelf of FIG. 1 during operation.

In some embodiments, however, baffles 128 and 130 are not included in the equipment shelf 100. FIG. 3 illustrates a temperature map of the equipment shelf 100 that does not include baffles 128, 130. The temperature map depicts temperatures of equipment and air within equipment shelf 100 while operating at steady state condition, at sea level, with an ambient air temperature of 40° C. As shown in FIG. 3, the temperature of the PSU 104 is generally higher than the temperature of the BBU 106. In particular, the temperature towards the back of the BBU 106 is 46.2° C. Because baffles 128 and 130 are not included in this embodiment, airflow mixing is present within the rear portion 126 of the equipment shelf 100 (e.g., towards the rear end 120 of the equipment shelf 100), resulting in a temperature that is between the temperature of the equipment in the upper region 108 and the temperature of the equipment in the lower region 110. For example, in the rear portion 126 near the fan 118 (e.g., where at least a portion of the air exits the equipment shelf 100), the temperature is 59.0° C. which is 12.8° C. higher than at the back of the BBU 106. In addition, the internal components of the PSU 104 are at different temperatures, including temperatures up to 110° C. The temperature of the air exiting the rear of the PSU 104 is approximately 60° C. to 65° C.

Figure 4:
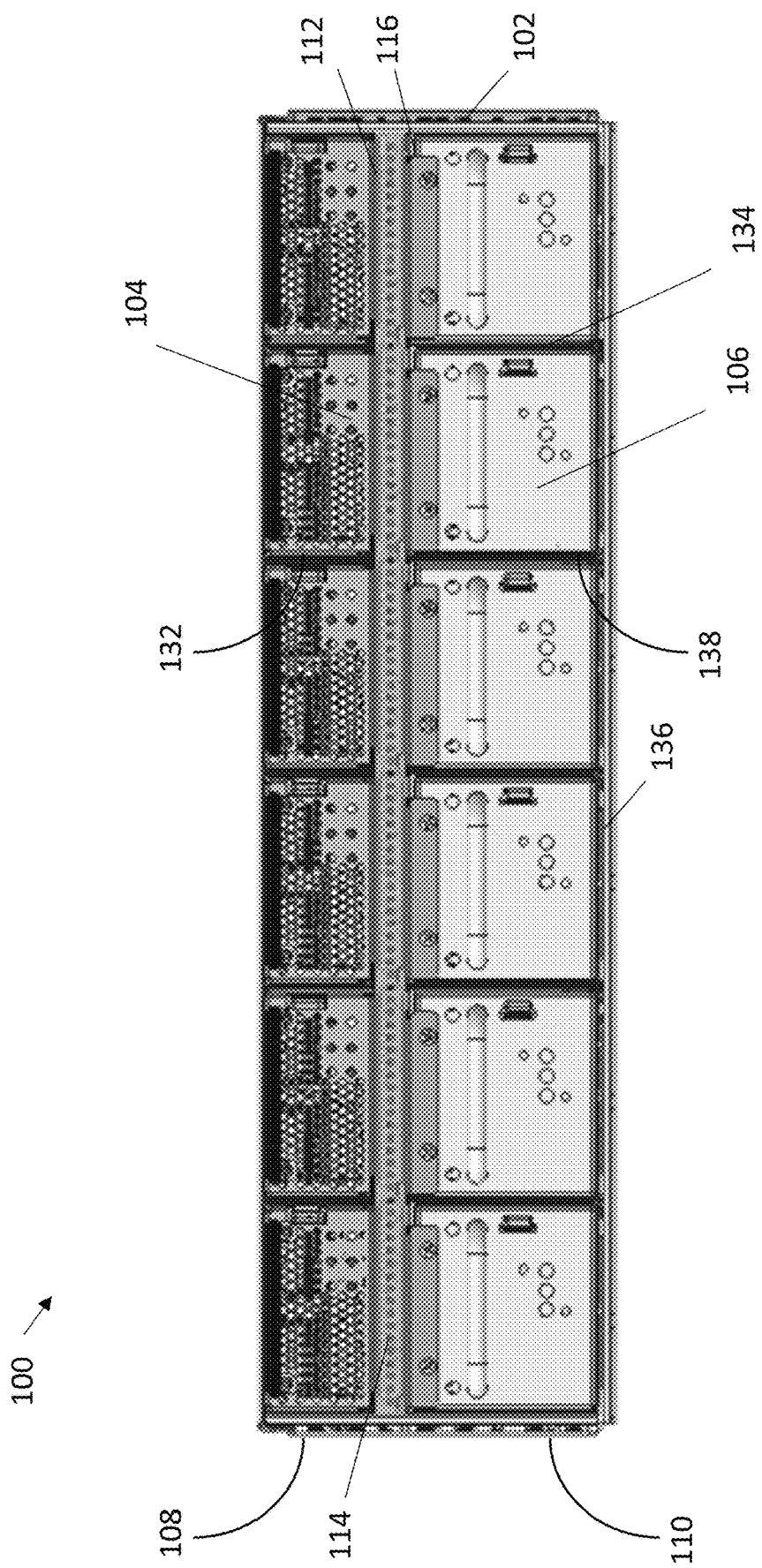
FIG. 4 is a front view of the equipment shelf of FIG. 1.

As shown in FIG. 4, the equipment shelf 100 includes multiple PSUs 104 and multiple BBUs 106. In particular, six PSUs 104 are included in the enclosure 102 in the upper region 108 of the equipment shelf 100 and six BBUs 106 are included in the enclosure 102 in the lower region 110 of the equipment shelf 100. In alternate embodiments, a greater or lesser number of PSUs 104 and BBUs 106 may be included in the equipment shelf 100. In the exemplary embodiment, each PSU 104 is positioned in a receptacle 132 of the enclosure 102 in the upper region 108 of the equipment shelf 100. The upper receptacles 132 are defined in part by support plate 112 and walls 134 of the enclosure 102. Walls 134 generally extend from a bottom plate 136 of the enclosure 102 to the top of the enclosure 102. Each BBU 106 is positioned in a receptacle 138 of the enclosure 102 in the lower region 110 of the equipment shelf 100. The lower receptacles 138 are defined by the bottom plate 136, the secondary plate 116, and walls 134. In this way, enclosure 102 includes two rows of receptacles: an upper row of receptacles 132 and a lower row of receptacles 138.

In some embodiments, the enclosure 102 includes only one row of receptacles (e.g., receptacles 132) for housing and/or receiving electronic equipment. In these embodiments, the airflow region 114 (e.g., configured as a channel) is coupled to either an upper surface of the enclosure 102 or the lower plate 136 of the enclosure 102. For example, when the airflow region 114 is coupled to the lower plate 136 of the enclosure 102, the lower plate 136 defines an upper surface defining the airflow region 114 (e.g., similar to support plate 112) and another plate (e.g., similar to secondary plate 116) is positioned below the airflow region 114 to further define the airflow region 114. In these embodiments, the equipment in the enclosure 102 may be heat-generating equipment and/or temperature-sensitive equipment and the airflow region 114 may be configured to generally lower the temperature of any structure or equipment defining the airflow region 114 (e.g., at a boundary or edge of the airflow region 114).

In some embodiments, walls 136 divide the airflow region 114 into multiple channels (e.g., six channels). Each channel of the airflow region 114 corresponds to a pair of one PSU 104 and one BBU 106 (e.g., a corresponding pair of PSUs 104 and BBUs 106). For example, each channel of the airflow region 114 is positioned between one PSU 104 and one BBU 106. The multiple channels of the airflow region 114 are parallel and permit air (e.g., at ambient temperature) to flow between PSUs 104 and BBUs 106 through the multiple channels in the same direction from a cool side of the equipment shelf 100 to a hot side of the equipment shelf 100 (e.g., from the front end 122 to the rear end 120, from the rear end 120 to the front end 122, etc.). In some embodiments, a filter (not shown) is coupled to the equipment shelf 100 to prevent dust, debris etc. from entering the equipment shelf 100 through the airflow region 114. In some embodiments, the equipment shelf 100 is generally rack-mounted such that one or more equipment shelves 100 may be mounted in a rack (not shown), for example, at a data center.

In another example embodiment, a power supply unit and an enclosure may both be modified to provide air into an airflow region. For example, in this embodiment, air may be provided to the airflow region from the modified power supply unit (e.g., from cooling air circulating through the power supply unit). A modified power supply unit (PSU) is illustrated in FIGS. 5A-5B and is indicated generally by reference number 204. As shown in FIGS. 5A-5B, the PSU 204 includes a case 240 surrounding the internal components of the PSU 204. The PSU 204 includes an internal fan (not shown) for cooling the PSU 204. In general, the internal fan of the PSU 204 enables cooling air to pass through the PSU 204. In the exemplary embodiment, the case 240 includes an air vent 242 in the case 240 (e.g., in a bottom surface of the case 240). The air vent 242 is positioned adjacent to the internal fan such that a portion of the cooling air flowing through the PSU 204 is diverted through the air vent 242 and into airflow region 114. The air vent 242 may comprise an opening, a grate, a grille, etc. for permitting the portion of diverted cooling air to exit the PSU 204 and enter airflow region 114.

A modified enclosure is illustrated in FIG. 6 and is indicated generally by reference number 202. As shown in FIG. 6, the modified enclosure 202 is similar to the enclosure 102, however, the modified enclosure 202 further includes an opening 244 in a support plate 212 of the enclosure 202. Similar to enclosure 102, enclosure 202 includes an upper region 208 including upper receptacles 232 for receiving electronic equipment (e.g., PSUs 204). Enclosure 202 also includes a lower region 210 including lower receptacles 238 for receiving electronic equipment (e.g., BBUs 106). In this way, the enclosure 202 is configured, via opening 244, to permit cooling air diverted from PSU 204 into the airflow region 114 (not shown in FIG. 6) positioned below the support plate 212. Although not shown in FIG. 6, enclosure 202 may include a plate such as secondary plate 116 to further define the airflow region 114 that extends through enclosure 202.

FIGS. 7A-7B illustrate another exemplary embodiment of an equipment shelf 200 that includes the modified enclosure 202 and at least one modified PSU 204 and at least one BBU 106 positioned within the modified enclosure 202. As shown in FIG. 7A, a PSU 204 is included in one of the upper receptacles 232 of the enclosure 202. For illustration purposes, the central lower receptacle 238 is not occupied by electronic equipment (e.g., a BBU 106) and the secondary plate 116 is not shown. FIG. 7B illustrates a view through the unoccupied receptacle 238 towards the support plate 212 of the upper receptacle 232 and the PSU 204. As shown in FIG. 7B, the opening 244 of the support plate 212 of enclosure 202 is generally larger than air vent 242 of PSU 204 and, in the illustrated embodiment, is generally rectangular in shape. In this way, the case 240 of PSU 204 is partially visible through the opening 244, when viewed through the unoccupied receptacle 238. Alternatively, the opening 244 may configured as other shapes (e.g., circular, square, etc.) and/or other sizes (e.g., as the same size as the air vent 242 of the PSU 204, smaller than the air vent 242, etc.). The air vent 242 of PSU 204 and the opening 244 of enclosure 202 enable a portion of cooling air to be diverted from the PSU 204 to flow through the airflow region 114.

FIG. 8 illustrates a flow diagram of airflow through the equipment shelf 200. As shown, a portion of cooling air flowing through PSU 204, as propelled by the internal fan (not shown) of PSU 204, is diverted through air vent 242 and into airflow region 114. As the portion of cooling air moves through the airflow region 114, the BBU 106 included in the equipment shelf 200 is thermally isolated from the heat-generating PSU 204. This cooling air also generally lowers the temperature of any structure or equipment defining the airflow region 114 (e.g., at a boundary or edge of the airflow region 214). Because the cooling air flowing through airflow region 114 cools the BBU 106, the BBU 106 is able to operate at lower temperatures, resulting in improved BBU performance. As such, equipment shelf 200 induces airflow through the airflow region 114 through the use of a fan included in the PSU 204, whereas the equipment shelf 100 induces airflow through the airflow region 114 through one or more fans 118 included on the equipment shelf 100.

In some embodiments, equipment shelf 200 also includes at least one baffle (similar to baffles 128 and 130). In these embodiments, the at least one baffle is configured to guide air from the airflow region 114 towards a rear end of the equipment shelf 200 and inhibit airflow mixing of exhaust from PSU 204 with air from the airflow region 114.

As shown in the following tables and FIGS. 9-11, varying the size (e.g., height) of an airflow region or channel within an equipment shelf impacts the temperature of equipment within the shelf. In particular, with respect to BBUs within the equipment shelf, varying the height of the airflow region enables the BBU to operate at lower temperatures which improves performance and functionality of the BBU. Table 1 characterizes the effect of varying the height (e.g., h as shown in FIG. 1) of a channel (e.g., airflow region 114, airflow region 214) within an equipment shelf (e.g., equipment shelf 100, equipment shelf 200) on the temperature of the battery back-up unit (e.g., BBU 106) (as measured at a case surrounding internal components of a BBU). As shown in Table 1, the temperature of the case of the battery back-up unit (e.g., BBU 106) was taken at the front of the case and at the rear of the case, in Celsius (° C.). The temperature of a power shelf controller (PSC) located in a rear portion of the equipment shelf was also measured, in Celsius (° C.). Table 1 also includes the speed of airflow through the channel (e.g., airflow region 114, airflow region 214), in units of cubic feet per minute (CFM). The values provided in Table 1 represent values obtained during simulated operation of an equipment shelf including a channel and rear fans (e.g., fans 118), with an output power of 18 kW, an input of 180 Vac, an ambient air temperature of 40° C., and exhaust from the PSU (e.g., PSU 104) at approximately 65° C. In the simulated embodiment, the equipment shelf does not include baffles (e.g., baffles 128, 130) and the PSU is not modified (e.g., PSU 104 included rather than PSU 204). As shown in Table 1, generally as the height (i.e., height h) of the channel is increased, the temperature of the battery back-up unit decreased.

TABLE 1

| Height of Channel (mm) | BBU Case Front (° C.) | BBU Case Rear (° C.) | PSC (° C.) | Airflow at Channel (CFM) |
| --- | --- | --- | --- | --- |
| 5 | 41.1 | 47.4 | 57.1 | 1.4 |
| 6 | 41.0 | 47.1 | 56.6 | 1.8 |
| 7 | 40.9 | 46.7 | 56.1 | 2.1 |
| 8 | 40.9 | 46.4 | 55.9 | 2.4 |
| 9 | 40.8 | 46.2 | 55.8 | 2.7 |
| 10 | 40.8 | 45.9 | 55.8 | 2.9 |

Similar to Table 1, Table 2 characterizes the effect of varying the height (e.g., has shown in FIG. 1) of the channel (e.g., airflow region 114, airflow region 214) on the temperature of the case of the battery back-up unit (e.g., BBU 106). The values provided in Table 2 represent values obtained during simulated operation of an equipment shelf including a channel and rear fans (e.g., fans 118), with an output power of 18 kW, an input of 240 Vac, an ambient air temperature of 40° C., and exhaust from the PSU (e.g., PSU 104) at approximately 61° C. Similar to the equipment shelf model of Table 1, the equipment shelf of this simulation does not include baffles (e.g., baffles 128, 130) and includes a PSU similar to PSU 104, rather than PSU 204. As shown in Table 2, the temperature of the case of the battery back-up unit (e.g., BBU 106) was taken at the front of the case and at the rear of the case, in Celsius (° C.). The temperature of the power shelf controller (PSC) was also measured, in Celsius (° C.). Table 2 also includes the speed of airflow through the channel (e.g., airflow region 114, airflow region 214), in units of cubic feet per minute (CFM). As shown in Table 2, generally as the gap size (i.e., height h) of the airflow region is increased, the temperature of the battery back-up unit decreased.

TABLE 2

| Height of Channel (mm) | BBU Case Front (° C.) | BBU Case Rear (° C.) | PSC (° C.) | Airflow at Channel (CFM) |
| --- | --- | --- | --- | --- |
| 5 | 40.9 | 46.0 | 52.9 | 1.4 |
| 6 | 40.8 | 45.5 | 52.7 | 1.8 |
| 7 | 40.8 | 45.3 | 52.5 | 2.1 |
| 8 | 40.8 | 45.1 | 52.4 | 2.4 |
| 9 | 40.8 | 44.9 | 52.3 | 2.7 |
| 10 | 40.7 | 44.8 | 52.2 | 2.9 |

FIG. 9 graphically illustrates the effect of increasing the height h of the channel (e.g., airflow region 114, 214) (also referred to herein as gap size) to the temperature at the rear portion of the BBU 106 case, using values from Tables 1 and 2. As shown in FIG. 9, as the gap size increases, the temperature of the rear portion of the BBU case decreases, regardless of the operating conditions of the power shelf (e.g., regardless of whether the 18 kW power shelf is operating with a 180 Vac input (and approximately 65° C. PSU exhaust) or a 240 Vac input (and approximately 61° C. PSU exhaust)). As gap sizes are increased (e.g., taller airflow regions), further reductions in temperature may be achieved. It can be appreciated that it may be necessary to balance such further reductions in temperature with overall size constraints and/or size concerns for the equipment shelf.

FIG. 10 graphically illustrates the temperature of a battery backup unit in several equipment shelves 10, 20, 30. Equipment shelves 10, 20, and 30 do not have certain features included in equipment shelf 100. For example, the values illustrated in FIG. 10 were obtained from equipment shelves including multiple power supply units and multiple battery backup units positioned within the equipment shelf. The PSUs included in the reference equipment shelves 10, 20, 30 are similar to PSUs 104 (e.g., are not modified similar to PSUs 204). Further, the PSUs included in the reference equipment shelves 10, 20, 30 are positioned directly on top of the BBUs (e.g., such that there is no gap between the PSUs and the BBUs). In contrast to equipment shelf 100, the reference equipment shelves do not include an airflow region (e.g., such as airflow region 114) such that the PSUs are not thermally isolated from the BBUs. The reference equipment shelves likewise did not include baffles (such as baffles 128, 130) or rear fans (such as fans 118).

During normal operating conditions of the reference equipment shelves, the PSUs generate heat inside of the equipment shelf and conduct at least a portion of that heat to the BBUs. Due to the heat generated by the PSUs, the temperature of the BBUs increases and puts the BBUs at risk of reaching (and exceeding) an over-temperature protection (OTP) limit. When the temperature has exceeded a safe value, OTP initiates a shutdown process to prevent malfunctioning or damage to the equipment. As shown in FIG. 10, the temperature of the BBUs of three equipment shelves 10, 20, 30 were measured during different modes of operation including at steady state, after a discharge period of three minutes, during and after an OTP recovery period, during a charge period, and again once the equipment shelves returned to steady state. As shown in FIG. 10, the OTP discharge limit for the equipment shelf is 65° C., the OTP charging limit for the equipment shelf is 50° C., and the OTP recovery temperature is 47° C.

A first reference equipment shelf 10 has an output power of 18 kW, a PSU fan speed of 27,000 rpm, and a charge current of 3.0 A that operated in an environment with an ambient air temperature of 40° C. As shown, at the start of testing, the BBUs of this equipment shelf 10 operated at a temperature of 56° C. During the discharge period, the BBUs of the equipment shelf 10 met the OTP discharge limit and eventually returned to their starting temperature, a temperature above the OTP recovery temperature. Because the BBUs of the first tested equipment shelf 10 did not return to the OTP recovery temperature, the BBUs were unable to charge.

A second reference equipment shelf 20 has an output power of 15 kW, a PSU fan speed of 36,000 rpm, and a charge current of 3.0 A that operated in an environment with an ambient air temperature of 40° C. As compared to the first reference equipment shelf 10, the reference equipment shelf 20 has a reduced output power and a better fan. As shown, at the start of testing, the BBUs of this equipment shelf 20 operated at a temperature of 48° C. During the discharge period, the BBUs of equipment shelf 20 did not meet the OTP discharge limit, but were unable to reach or fall below the OTP recovery temperature. Because the BBUs of the second tested equipment shelf 20 did not return to the OTP recovery temperature, the BBUs were unable to charge.

A third reference equipment shelf 30 has an output power of 15 kW, a PSU fan speed of 36,000 rpm, and a charge current of 2.0 A that operated in an environment with an ambient air temperature of 35° C. As compared to the first reference equipment shelf 10, the reference equipment shelf 30 has a reduced power output power and a better fan. The reference equipment shelf 30 also operates at a lower ambient air temperature and is subject to a longer charge. As shown, at the start of testing, the BBUs of this equipment shelf 30 operated at a steady state temperature of 43° C. During the discharge period, the temperature of the BBUs of equipment shelf 30 increased but did not meet the OTP discharge limit. The temperature of the BBUs continued to drop during the OTP recovery period and met the OTP recovery temperature. During charging of the BBUs at 2.0 A, the temperature of the BBUs of equipment shelf 30 again increased and subsequently returned to steady state after the BBUs were fully charged.

As can be appreciated from FIG. 10, relaxing the shelf output power, reducing the BBU charge rate, and/or improving the PSU fan performance may be insufficient to allow the BBU to be safely charged after a full power discharge, without also lowering the ambient temperature, as the BBU was unable to cool sufficiently to reach the OTP recovery temperature. To achieve charging, the ambient temperature may also need to be reduced.

FIG. 11 graphically illustrates the temperature of a battery backup unit (e.g., BBU 106) in equipment shelf 100 during several different modes of operation. The equipment shelf 100 used in FIG. 11 includes an airflow region 114 with a height of 7 mm, fans 118, and PSUs 104, but does not include baffles 128, 130 or PSUs 204. The equipment shelf 100 used in FIG. 11 operated in an environment with an ambient air temperature of 40° C. with an output power of 15 kW, a charge current of 3.0 A, and a PSU fan speed of 36,000 rpm. As shown, the equipment shelf 100 is able to discharge and fully charge without exceeding OTP limits. In this way, as compared to reference equipment shelf 20 for example, implementing the features of equipment shelf 100 such as an airflow region 114, etc. results in a performance improvement that is equivalent to reducing the ambient air temperature by at least 5° C.

Example embodiments described herein may enhance and improve thermal performance of equipment housed in the equipment shelf. For example, the equipment shelf may allow for thermal isolation of temperature-sensitive equipment (e.g., battery back-up units (BBUs)) from heat-generating equipment (e.g., power supply units (PSUs)) using moving air between the equipment housed within the same shelf through an airflow region. The airflow region allows relatively cool ambient air to flow over the BBUs which keeps their temperature lower (e.g., at or near ambient temperatures). This lower temperature creates a "thermal bonus" which may be utilized or "spent" to enhance performance of the equipment shelf in one or more ways including higher power output, longer life, higher efficiency, increased reliability, improved acoustics through lower fan speeds, etc. These embodiments further minimize the risk of BBUs reaching over-temperature protection (OTP) due to heat generated inside the power shelf by the PSUs during normal operating conditions as the BBUs are thermally isolated from the PSUs. In this way, by keeping the BBUs at lower temperatures, BBU functionality and performance is improved, resulting in higher discharge rates, higher efficiency, longer battery life, quicker recharge of BBUs in a shelf with PSUs, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An equipment shelf comprising:
   at least one power supply unit (PSU) positioned in an upper region of the equipment shelf, wherein one PSU of the at least one PSU comprises:
   a plurality of internal components;
   a case surrounding the plurality of internal components; and
   an internal fan positioned within the case and configured to cause cooling air to pass through the at least one PSU to cool the plurality of internal components;
   at least one battery backup unit (BBU) positioned in a lower region of the equipment shelf; and
   an airflow path extending through the equipment shelf between the upper region and the lower region;
   wherein the airflow path separates the upper region of the equipment shelf from the lower region of the equipment shelf and thermally isolates the at least one PSU in the upper region from the at least one BBU in the lower region when air flows through the airflow path; and wherein the case includes an air vent formed in a bottom surface thereof and positioned adjacently to the internal fan, whereby a portion of the cooling air is diverted to flow through the airflow path.

2. The equipment shelf of claim 1, further comprising an enclosure including at least a first plate in the upper region and a second plate in the lower region.

3. The equipment shelf of claim 1, wherein the airflow path is at least partially defined by the first plate and the second plate.

4. The equipment shelf of claim 1, wherein the at least one PSU is coupled to the first plate; and
wherein the at least one BBU is coupled to the second plate.

5. The equipment shelf of claim 1, wherein the first plate includes at least one opening to duct the diverted air from the at least one PSU into the airflow path.

6. A power shelf comprising:
an enclosure having a plurality of upper receptacles and a plurality of lower receptacles;
multiple power supply units (PSUs) positioned within the plurality of upper receptacles;
multiple battery back-up units (BBUs) positioned within the plurality of lower receptacles; and
an airflow region between the multiple PSUs and the multiple BBUs;
at least one fan coupled to the airflow region and configured to enable airflow through the airflow region; and
wherein the fan is positioned at an end of the power shelf and draws air into the airflow region from an opposite end of the power shelf.

7. The power shelf of claim 6, wherein the airflow region is at least partially defined by upper surfaces of the plurality of lower receptacles and bottom surfaces of the plurality of upper receptacles.

8. The power shelf of claim 6, wherein the enclosure includes an equal number of the upper receptacles and the lower receptacles.

9. The power shelf of claim 6, wherein the airflow region comprises multiple channels, each channel corresponding to a pair of one of the multiple PSUs and one of the multiple BBUs.

10. The power shelf of claim 9, wherein the multiple channels are substantially parallel and permit airflow through the shelf in the same direction.

11. A rack-mounted equipment shelf comprising:
an enclosure having at least one receptacle for housing electronic equipment, wherein the at least one receptacle includes multiple upper receptacles positioned in an upper region of the enclosure and multiple lower receptacles positioned in a lower region of the enclosure;
electronic equipment positioned within the multiple upper receptacles and within the multiple lower receptacles;
a channel coupled to the enclosure, wherein the channel is positioned between the upper region and the lower region;
at least one fan coupled to the channel to draw air through the channel, whereby the air drawn through the channel maintains the electronic equipment and/or the shelf at a desired temperature; and
one or more baffles positioned between the electronic equipment positioned within the multiple upper receptacles and a rear end of the enclosure, the one or more baffles configured to inhibit a mixing of a cooling air flowing through the electronic equipment positioned within the multiple upper receptacles with the air drawn through the channel.

12. The rack-mounted equipment shelf of claim 11, wherein the electronic equipment includes at least one power supply unit (PSU).

13. The rack-mounted equipment shelf of claim 11, wherein the electronic equipment includes at least one battery back-up unit (BBU).

14. The rack-mounted equipment shelf of claim 11, wherein the channel is coupled to an upper surface of the enclosure.

15. The rack-mounted equipment shelf of claim 11, wherein the channel is coupled to a lower surface of the enclosure.

* * * * *